(12) United States Patent
Mulder et al.

(10) Patent No.: US 6,873,210 B2
(45) Date of Patent: Mar. 29, 2005

(54) SINGLE-ENDED-TO-DIFFERENTIAL CONVERTER WITH COMMON-MODE VOLTAGE CONTROL

(75) Inventors: Jan Mulder, Houten (NL); Marcel Lugthart, Utrecht (NL); Chi-Hung Lin, Houten (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/791,878

(22) Filed: Mar. 4, 2004

(65) Prior Publication Data

US 2004/0164770 A1 Aug. 26, 2004

Related U.S. Application Data

(63) Continuation of application No. 10/425,736, filed on Apr. 30, 2003, now Pat. No. 6,727,756, which is a continuation of application No. 10/105,253, filed on Mar. 26, 2002, now Pat. No. 6,771,127.

(51) Int. Cl.$^7$ ................................................ H03F 3/45
(52) U.S. Cl. ....................... 330/258; 330/117; 330/301; 330/307; 330/284; 327/307; 327/346
(58) Field of Search ................................. 330/258, 117, 330/301, 307, 284; 327/307, 346

(56) References Cited

U.S. PATENT DOCUMENTS

| | | |
|---|---|---|
| 3,516,005 A | 6/1970 | Brown, Jr. |
| 3,761,831 A | 9/1973 | Foerster |
| 4,206,416 A | 6/1980 | Kellogg |
| 5,049,831 A | 9/1991 | Westwick ................ 330/258 |
| 5,880,690 A | 3/1999 | Rothenberg ............. 330/258 |
| 6,118,322 A | 9/2000 | Bockelman et al. |
| 6,160,446 A | 12/2000 | Azimi et al. |

FOREIGN PATENT DOCUMENTS

| | | |
|---|---|---|
| JP | 58057806 A | 4/1983 |
| JP | 3119813 | 5/1991 |

OTHER PUBLICATIONS

Wu et al., New Fully Differential HF CMOS OP Amps With Efficient Common Mode Feedback, IEEE International Symposium on Circuits and Systems, vol. 3, May 8–11, 1989, pp. 2076–2079.

Duque–Carrillo, "Input Common–Mode Feedback Technique for Very Low Voltage CMOS Amplifiers," IEEE Circuits and Systems, vol. 2, May 30, 1999 to Jun. 2, 1999, pp. 25–28.

European Search Report issued Sep. 3, 2004 for Appln. No. EP 03 00 6954, 3 pages.

*Primary Examiner*—Michael B. Shingleton
(74) *Attorney, Agent, or Firm*—Sterne, Kessler, Goldstein & Fox P.L.L.C.

(57) ABSTRACT

Provided is a circuit to perform single-ended to differential conversion while providing common-mode voltage control. The circuit includes a converter to convert a single-ended signal to a differential signal and a stabilizing circuit adapted to receive the differential signal. The stabilizing circuit includes a sensor configured to sense a common-mode voltage level of the differential signal and a comparator having an output port coupled to the converter. The comparator is configured to compare the differential signal common-mode voltage level with a reference signal common-mode voltage level and produce an adjusting signal based upon the comparison. The adjusting signal is applied to the converter via the output port and is operative to adjust a subsequent common-mode voltage level of the differential signal.

4 Claims, 6 Drawing Sheets

SINGLE-ENDED-TO-DIFFERENTIAL CONVERTER WITH COMMON-MODE VOLTAGE CONTROL

This application is a continuation of the U.S. Non-Provisional Application entitled "Single-Ended-To-Differential Converter with Common-Mode Voltage Control," Ser. No. 10/425,736, filed Apr. 30, 2003, now U.S. Pat. No. 6,727,756 which is a continuation of U.S. Non-Provisional Application entitled "Single-Ended-To-Differential Converter with Common-Mode Voltage Control," Ser. No. 10/105,253, filed Mar. 26, 2002, now U.S. Pat. No. 6,771,127, all of which is incorporated herein in its entirety by reference.

BACKGROUND OF THE INVENTION

1. Field of the Invention

The present invention relates to single-ended to differential converters. More particularly, the present invention relates to a circuit technique to perform attenuation and single-ended to differential conversion with common-mode voltage control on a single integrated circuit (IC).

2. Background Art

Advances in electronic device packaging provide electronic system designers with the ability to include an increased number of functions on a single IC. Such ICs are particularly well suited for low supply voltage applications, especially those ICs that can accommodate processing of analog signals. Thus, by combining numerous functions on a single IC, electronic system designers are able to realize tremendous savings in power consumption and space. Even greater functional advantages can be realized through the selection of particular signal processing techniques to be used on these ICs.

For example, in the case of analog signals on single ICs, differential signal processing is preferred over single-ended processing because it provides better rejection of power supply and substrate noises. Differential signal processing is also inherently better at rejecting common-mode voltages than single-ended processing. For purposes of illustration, differential signal processing is commonly used in single-chip video receivers, also known as on-chip receivers. In on-chip receivers, however, certain applications often benefit more from the input of single-ended signals instead of differential signals. Also, from the standpoint of hardware, single-ended signals may be preferred as circuit inputs because they are easier to provide as circuit inputs and can be more cheaply produced than their differential-ended versions. When single-ended signals are provided as circuit inputs, conventional on-chip receivers normally include additional on-chip circuitry to convert the received single-ended signals into differential signals in order to facilitate the more advantageous differential signal processing.

A number of traditional techniques exist to convert single-ended signals to differential signals. One popular technique includes converting the single-ended signal from the voltage domain to the current domain. With this particular technique, the single-ended signal is received at one of the inputs of a voltage to current converter. In response, the converter produces at its output, a differential signal, having a positive signal component and a negative signal component. Both signal components, however, are in the current domain. To convert this differential current signal from current domain to voltage domain, the differential signal is forwarded to a current to voltage converter, such as resistor, in order to finally create the differential voltage signal. One deficiency with this approach is that it's not well suited for low voltage power supplies. More specifically, it's difficult to fit this approach within the voltage head-room constraints of low voltage power supplies.

Another technique for converting single-ended signals to differential signals includes the use of a degenerate differential pair. However, when providing one side of a degenerate differential pair with a relatively large signal, while at the same time, leaving the other side at a constant voltage, its extremely difficult to achieve acceptable linearity. Providing one side of the degenerate differential pair with a large signal and leaving the other side at a constant voltage is required in order to convert a single-ended signal to a differential signal.

In addition to single-ended to differential converters, attenuators are also circuits that are commonly used in on-chip receivers. When used to attenuate input signals, the dynamic range of attenuators can be adjusted to fit within the dynamic range of subsequent signal processing blocks, such as track and hold circuits or analog-to-digital converters (ADCs).

Although numerous traditional techniques exist to convert single-ended signals into differential signals, low voltage power supplies often do not provide adequate voltage head-room to accommodate efficient use of these traditional techniques. As a result, there is a need for a device that can provide and improved approach for converting a single-ended signal to a differential signal without the deficiencies of the traditional approaches discussed above. Also, there is a need to provide an improved single-ended to differential conversion technique and an attenuator on a single IC chip to save power and optimize circuit board space.

BRIEF SUMMARY OF THE INVENTION

Consistent with the principles of the present invention as embodied and broadly described herein, an exemplary circuit includes an attenuator having first and second receiving ports configured to respectively receive first and second input signals and differential output ports configured to output a differential signal produced in accordance with the first and second input signals. The attenuator also includes an adjusting node positioned in association with the differential output ports. A stabilizing circuit, including a sensor and a comparator, is configured to receive the differential signal. The sensor is coupled across the differential output ports and has a feedback node. The comparator includes two input ports and a comparator output port. A first of the two input ports is coupled to the feedback node and the other of the two input ports is configured to receive a reference voltage signal. The comparator output port is coupled to the adjusting node. The sensor is configured to detect a common-mode voltage level of the differential signal and provide the detected common-mode voltage level to the first input port. The comparator is configured to compare the common-mode voltage level to a level of the reference voltage signal and produce an adjusting voltage signal based upon the comparison. Finally, the adjusting voltage signal is applied to the adjusting node and is operative to adjust a subsequent common-mode voltage level of the differential signal.

Features and advantages of the present invention include the ability to beneficially combine the functions of a low power single-ended to differential converter and an attenuator on a single IC. This approach increases the performance and provides additional space on the IC for incorporation of added functions. Additional advantages of the present invention are the ability to provide single-ended to differential conversion in a manner that fits within the voltage headroom constraints of low voltage power supplies and a provision for controlling common-mode voltage in an efficient manner.

BRIEF DESCRIPTION OF THE FIGURES

The accompanying drawings, which are incorporated in and constitute a part of the specification, illustrate an embodiment of the invention and, together with the description, explain the purpose, advantages, and principles of the invention. In the drawings.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one of skill in the art that the present invention, as described below, may be implemented in many different embodiments of hardware, software, firmware, and/or the entities illustrated in the figures. Any actual software code with specialized controlled hardware to implement the present invention is not limiting of the present invention. Thus, the operation and behavior of the present invention will be described with the understanding that modifications and variations of the embodiments are possible, given the level of detail presented herein.

Figure 1:
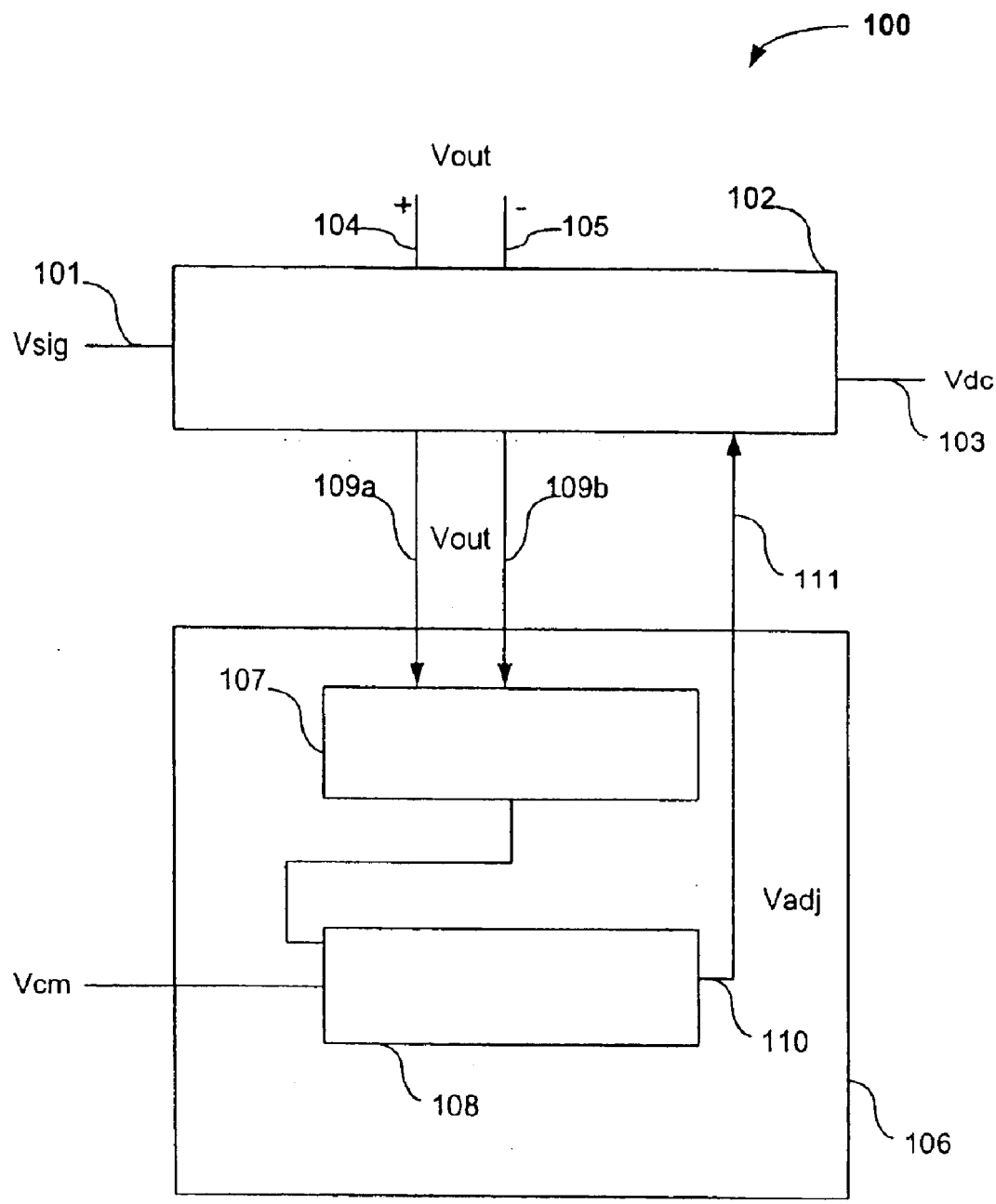
FIG. 1 is a block diagram of an exemplary implementation of the present invention.

FIG. 1 is a block diagram of the exemplary embodiment of the present invention. Included in FIG. 1 is a circuit 100 including a converter 102 and a stabilizing circuit 106. The converter 102 is provided to convert a single-ended input single $V_{sig}$ received at an input terminal 101, into a differential output signal $V_{out}$. The differential output signal $V_{out}$ is then provided at respective positive and negative differential output terminals 104 and 105. In order to make the converter 102 symmetrical, an input terminal 103 is provided for receiving a matching DC voltage signal $V_{dc}$ as an input. That is, the signal $V_{dc}$, provided from a DC voltage source, has a voltage level substantially equivalent to an average of the voltage level of signal $V_{sig}$. The converter 102, as will be discussed in greater detail below, receives the input signals $V_{sig}$ and $V_{dc}$ and converts these signals into the differential output signal $V_{out}$. The symmetry between the relationship of $V_{sig}$ and $V_{dc}$ minimizes substrate noise since signals having roughly equivalent average signal levels are input at both sides of the converter 102. In an exemplary embodiment, the degree to which the levels between $V_{sig}$ and $V_{dc}$ match is within about ±10%, although other tolerances may be selected. This symmetry provides a degree of balance to the converter and prevents the occurrence of substrate and other noises appearing at the output terminals 104 and 105.

As stated above, a popular technique for converting single-ended signals to differential signals includes converting the received single-ended signal from the voltage domain to current domain and then back to the voltage domain. Although this technique is not particularly well suited for low voltage application, an inherent benefit is elimination of undesirable common-mode voltages. As known in the art, common-mode voltages may result from a number of different factors such as improper circuit grounding or noise in the actual input source, etc. Converting single-ended signals to differential signals using the voltage to current conversion technique removes these unwanted common-mode voltage components. In the present invention, however, the stabilizing circuit 106 is provided to remove unwanted common-mode voltage components, in place of the voltage to current conversion technique discussed above.

The stabilizing circuit 106 includes a sensor 107 and a comparator 108. The sensor 107 is configured to detect the common-mode voltage level of the differential output signal $V_{out}$. In particular, the sensor 107 is coupled to the converter 102 via connection leads 109 and receives the differential signal $V_{out}$ as an input thereto. The sensor 107 then provides a measurement of the common-mode voltage level of the differential output signal $V_{out}$ to the comparator 108. The comparator 108 also receives a reference common-mode voltage signal $V_{cm}$ as an input from a reference voltage source (not shown). The comparator 108 compares the measured common-mode voltage level of the differential signal $V_{out}$ with the reference common-mode voltage signal $V_{cm}$ and provides an adjusting signal $V_{adj}$ at an output terminal 110 of the comparator 108. The adjusting signal is representative of the difference between the reference common-mode voltage signal $V_{cm}$ and the common-mode voltage level of the differential output signal $V_{out}$. The adjusting signal $V_{adj}$ is then provided to the converter 102 along a feedback path 111 in order to adjust the common-mode voltage level of the differential output signal $V_{out}$.

The output of the comparator 108 may be used in a number of different ways. The value of the adjusting signal $V_{adj}$ output from the comparator 108 is equal to a gain (A) of the comparator 108 multiplied by a difference between the voltage $V_{cm}$ and the common-mode voltage level of the differential output signal $V_{out}$. In other words $V_{adj}=A^*(V_{cm}-V_{out})$. The adjusting signal $V_{adj}$ is therefore operative to adjust the common-mode voltage level of the differential signal $V_{out}$, more specifically, a subsequent common-mode voltage level of $V_{out}$.

Figure 2:
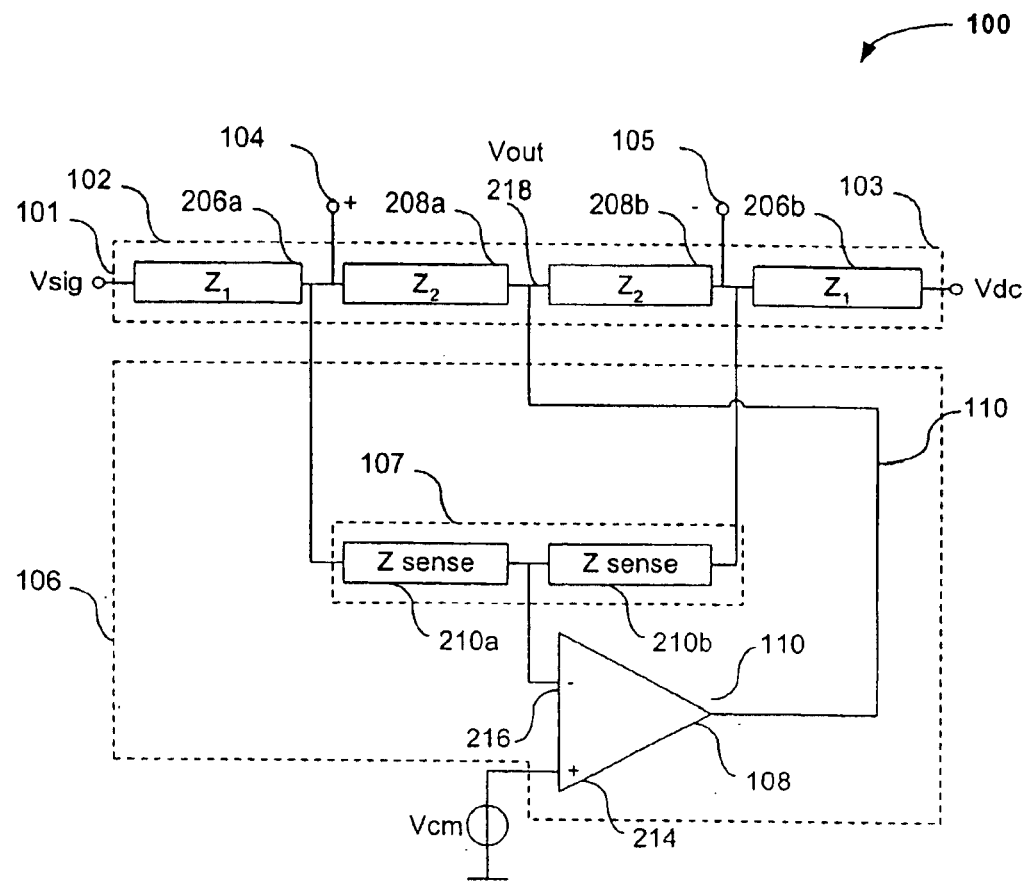
FIG. 2 is a schematic diagram of an exemplary circuit constructed and arranged in accordance with the present invention.

FIG. 2 provides a more detailed view of the circuit 100, including the converter 102 and the stabilizing circuit 106. The converter 102 includes an attenuator formed of two sets of impedance devices 206a/206b and 208a/208b. The primary function of the impedance devices 206a/206b and 208a/206b is to attenuate $V_{sig}$ and convert $V_{sig}$ to a differential output signal. As shown in FIG. 2, the impedance devices 208a and 208b are positioned adjacent to one another and connected together in series. The impedance device 206a is connected in series with the impedance device 208a and the impedance device 206b is connected in series with the impedance device 208b.

In a preferred embodiment of the present invention, the impedance devices 206a and 206b have a substantially equal impedance value ($Z_1$), and the impedance devices 208a and 208b have a substantially equal impedance value, ($Z_2$). Furthermore, the value of impedance devices 206a and 206b is chosen as a function of the desired degree of attenuation to be provided by the converter 102. A connection node between the impedance devices 206a and 208a forms the output terminal 104 and a connection node between the impedance devices 206b and 208b forms the output terminal 105. The signal input terminal 101 is formed by an unconnected side of the impedance device 206a. Additionally, the signal input terminal 103 is formed by an unconnected side of the impedance device 206b.

As explained above, during operation of the circuit 100, the single-ended input signal $V_{sig}$ is provided to the input terminal 101 and the DC voltage signal $V_{dc}$ is provided at the input terminal 103. Although the differential signal $V_{out}$ may also be produced as a result of applying only the input signal $V_{sig}$ to the input terminal 101, the input signal $V_{dc}$ is provided at the input terminal 103 to make the converter 102 symmetrical, as discussed above. When $V_{sig}$ and $V_{dc}$ are applied to respective input terminals 101 and 103 in a near simultaneous manner, the differential output signal $V_{out}$ is produced at the output terminals 104 and 105.

The conversion technique used by the converter 102 provides a significant improvement in linearity over the conventional approaches. For example, in video applications, a linearity of about 60 dB or better is desirable to insure adequate processing of video signals. However, using the degenerate differential pair technique of the conventional approaches, the achieved linearity may be much less than 60 dB. In an exemplary embodiment of the present invention, however, linearities of about 80 dB are possible, over 20 dB better than the conventional approaches. Although the conversion technique of the present invention provides better linearity, it lacks the inherent common-mode rejection capability inherent in the conventional approaches. Therefore, the stabilizing circuit 106 is provided to suppress the common-mode voltage of the differential signal $V_{out}$.

The common-mode sensor 107 of the stabilizing circuit 106 includes a third set of impedance devices 210a and 210b, also connected in series. In a preferred embodiment of the present invention, the impedance devices may be resistors or any other suitable devices. Also, the impedance devices 210a and 210b have a substantially equal impedance value $Z_{sense}$. Further, in most applications, the impedance value of the impedance devices 210a and 210b is higher than the impedance value of the devices 208a and 208b. One end of the device 210a is coupled to the output terminal 104, and one end of the impedance device 210b is coupled to the output terminal 105. Connected in this manner, the impedance devices 210a and 210b are arranged to measure the common-mode voltage of the differential output signal $V_{out}$.

Also as shown in FIG. 2, a connection node 213 is formed between the impedance devices 210a and 210b and is coupled to an inverting input terminal 216 of the comparator 108. The comparator 108 may be for example, an operational amplifier. The reference common-mode voltage $V_{cm}$ is provided as an input to a non-inverting input terminal 214. The reference voltage $V_{cm}$ may be provided by any conventional voltage generation means. Finally, the output terminal 110 is connected via the feedback path 111, to a node 218 between the impedance devices 208a and 208b, thus providing a negative feedback mechanism. The comparator 108 receives the detected common-mode voltage from the sensor 107, compares it with the reference common-mode voltage $V_{cm}$, and adjusts the detected common-mode voltage to match $V_{cm}$. That is, the comparator 108 provides a push pull arrangement which suppresses the common-mode voltage of the differential output signal $V_{out}$, if its common-mode voltage is greater than $V_{cm}$, and boosts the common-mode voltage if the common mode voltage is less than $V_{cm}$.

Since most circuits that receive outputs from single-ended to differential converters, such as track and hold circuits and ADCs, are sensitive to common-mode jump, an efficient technique is desirable for controlling the common-mode voltages associated with the differential signal $V_{out}$. In the embodiment shown in FIG. 2, the adjusting signal, provided at the output terminal 110, is injected into the converter at the node 218 in order to adjust the common-mode output of the differential output signal $V_{out}$. The common-mode voltage associated with $V_{out}$ can be adjusted up or down in accordance with the technique discussed above.

If the voltage values of $V_{sig}$ and $V_{dc}$ are suitable to drive the entire circuit 100, they may be applied directly to input terminals 101 and 103, as shown in FIG. 2. If, on the other hand, $V_{sig}$ and $V_{dc}$ are not suitable for driving the entire circuit 100 then voltage buffers may be required at the input terminals 101 and 103 as shown in FIG. 3, to provide increased driving capability.

Figure 3:
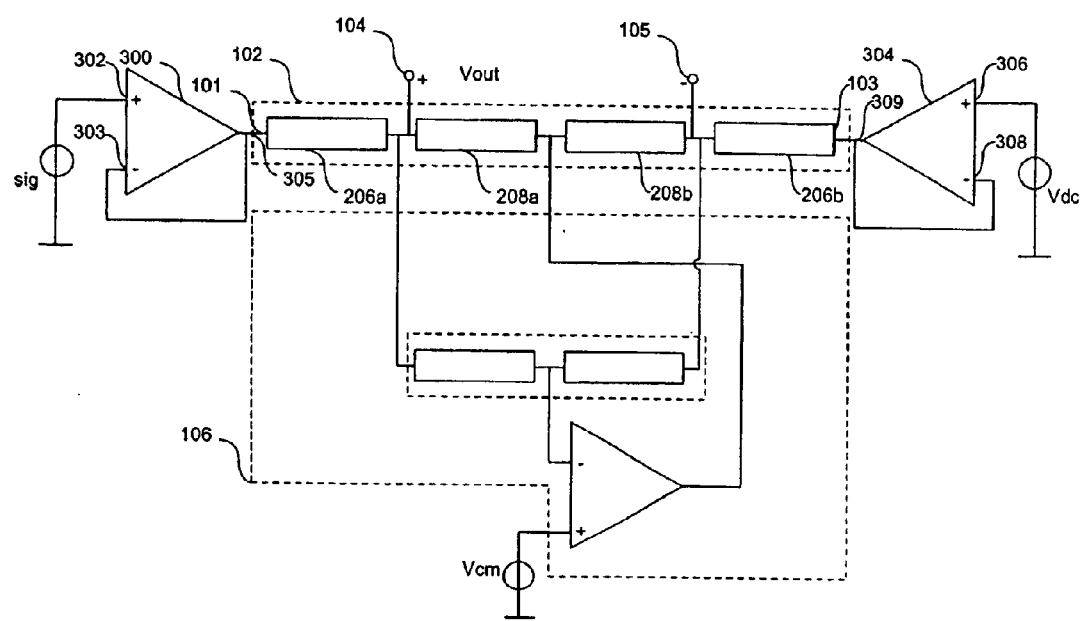
FIG. 3 is a schematic diagram of the circuit of FIG. 2 including voltage buffers.

FIG. 3 is an illustration of the circuit arrangement of FIG. 2 modified to include voltage buffers 300 and 304. The voltage buffers 300 and 304 are respectively connected to the input terminals 101 and 103. The buffers 300 and 304 may be formed, for example, of operational amplifiers. The voltage buffer 300 includes a non-inverting input terminal 302 adapted to receive the input signal $V_{sig}$ as an input and an inverting input terminal 303 coupled to a buffer output terminal 305. The output terminal 305 is connected to the input terminal 101 of the converter 102. Similarly, the voltage buffer 304 includes a non-inverting input terminal 306 adapted to receive the input signal $V_{dc}$ as an input and an inverting input terminal 308 connected to a buffer output terminal 309. The output terminal 309 is connected to the input terminal 103 of the converter 102. In this arrangement, the attenuator formed by the impedance devices 206a, 206b, 208a, and 208b loads the outputs of the buffers 300 and 304. The buffers then attenuate $V_{sig}$ in accordance with the following expression:

$$\frac{Z_2 \| Z_{sense}}{Z_1 + Z_2 \| Z_{sense}}$$

The differential output voltage $V_{out}$ is the output of the converter 102. As stated above however, if the signals $V_{sig}$ and $V_{dc}$ are adequate to drive at the circuit 100, then the buffers 300 and 304 will not be needed.

Figure 4:
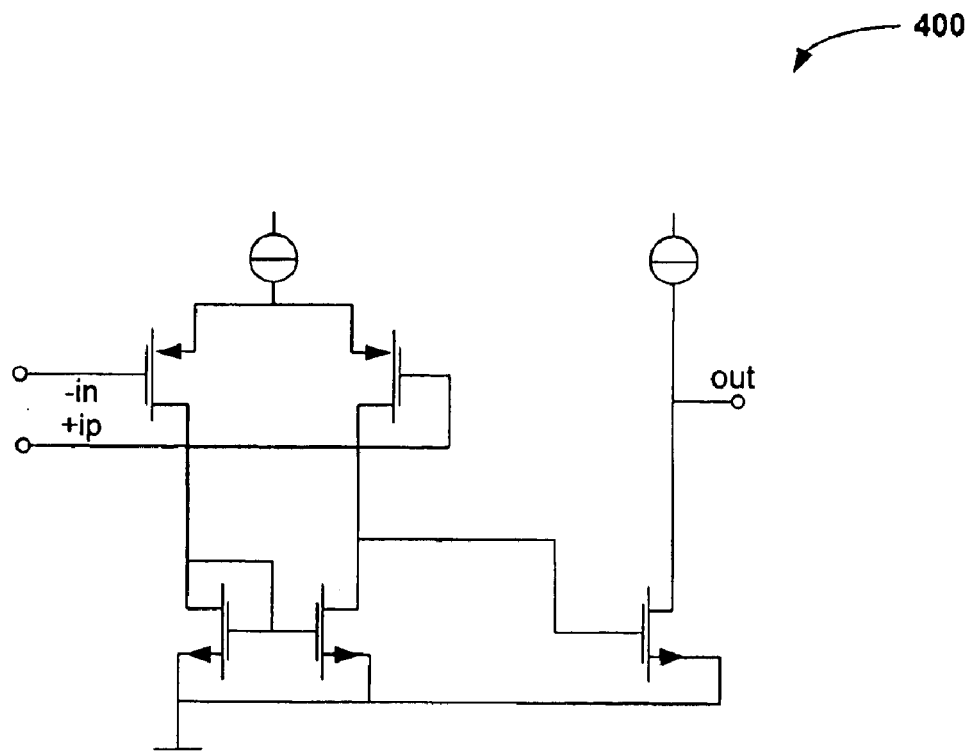
FIG. 4 is a schematic diagram of a conventional amplifier used in the circuits of FIG. 2 and FIG. 3.

The suitability of the converter 102, shown in FIGS. 2 and 3, for operation in a low voltage environment depends on the implementation of the amplifiers used in the comparator 108 and the voltage buffers 300 and 304. FIG. 4 shows an exemplary well known op-amp implementation that is suitable for this application. The op-amp has respective inverting and non-inverting input terminals labeled (−in) and (+ip) and an output terminal labeled (out).

Each circuit shown in FIGS. 2 and 3 is substantially internally symmetrical except that each is driven in a single-ended manner. Symmetry is beneficial for rejection of power supply and substrate noise, with the symmetry being defined as the ability to swap $V_{sig}$ and $V_{dc}$, and the use of virtually identical circuit components on each side of the converter 102 as shown, for example, in FIGS. 2 and 3. In the case of FIG. 2 and FIG. 3, although the converter 102 is configured as a single-ended to differential converter, it can also be driven differentially by applying a differential signal to the voltage buffers 300 and 304.

Figure 5:
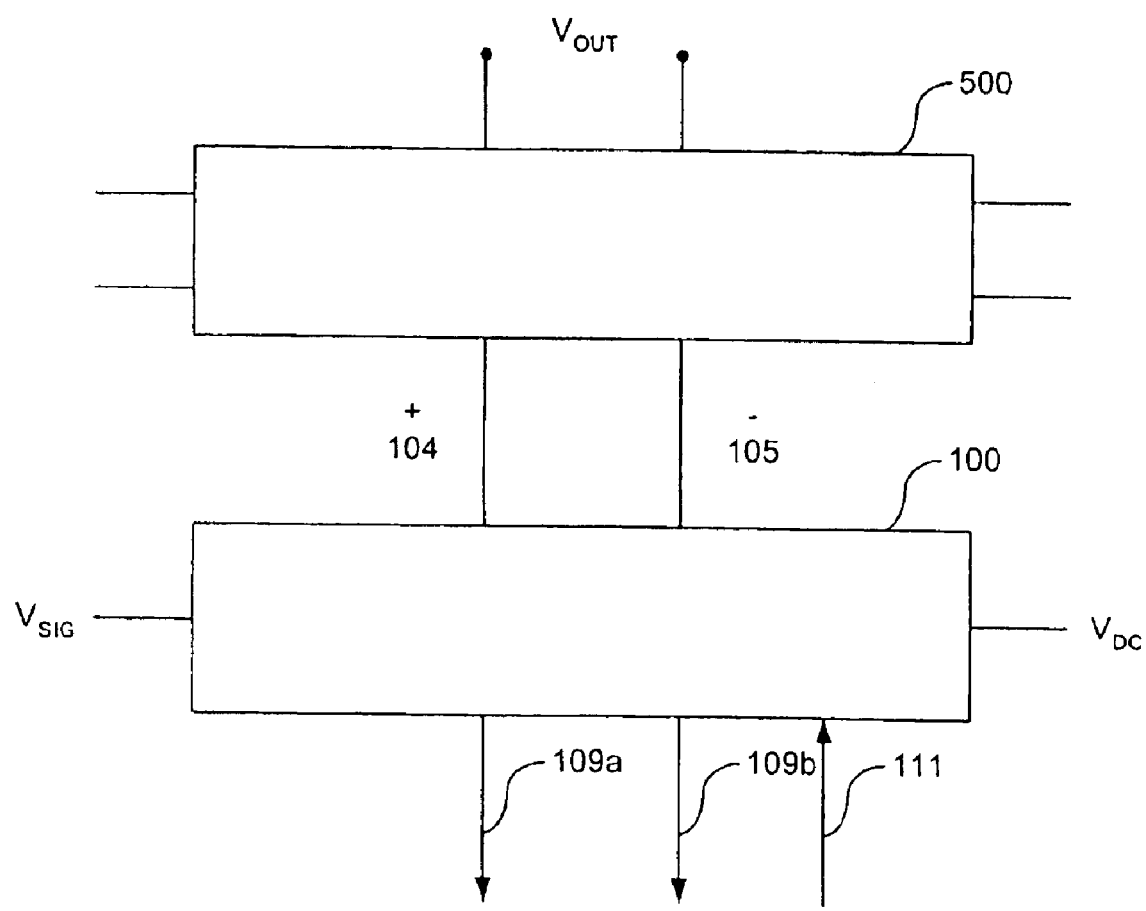
FIG. 5 is a block diagram of a programmable gain attenuator used in a preferred embodiment of the present invention.

An exemplary embodiment of the present invention can also be configured to accommodate programmability. For example, FIG. 5 shows a conventional programmable gain attenuator 500, which can be directly connected to the output terminals 104 and 105 of the single-ended to differential converter to permit a user to program specific attenuation values related to the output signal $V_{out}$.

Figure 6:
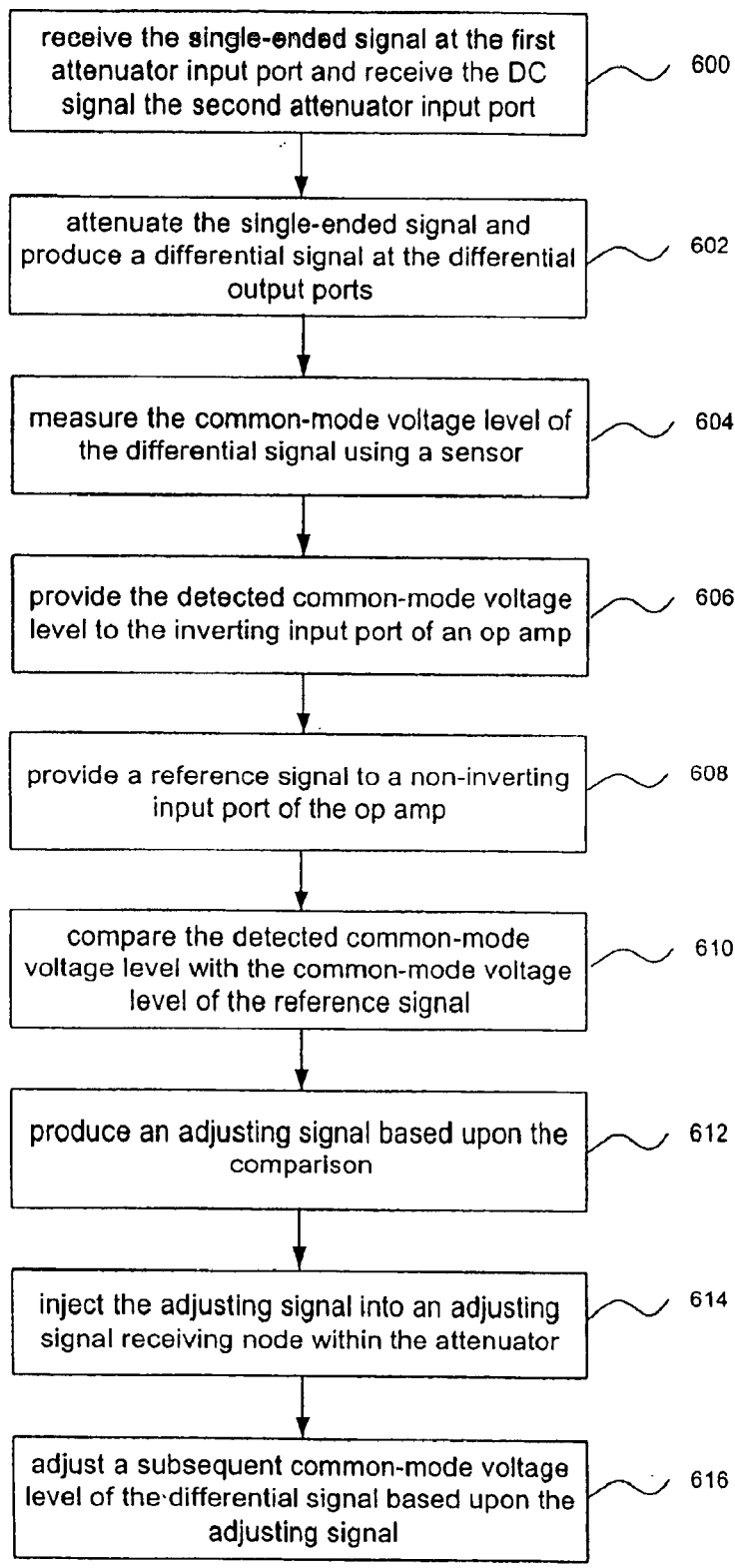
FIG. 6 is a flow chart of an exemplary method of practicing the present invention.

FIG. 6 illustrates a flowchart of an exemplary method of practicing the present invention. As shown in FIG. 6 and explained with reference to FIG. 2, the conversion process begins by the circuit 100 receiving a single-ended signal at the input terminal 101 and a DC signal at the input terminal 103 as described in block 600 of FIG. 6. Next, the single-ended signal is attenuated and a differential signal is produced at the output terminals 104 and 105 as described in block 602.

The sensor 107 measures the common-mode voltage level of the differential signal and provides the detected common-mode voltage level to the inverting input terminal 216 of the comparator 108 as described in blocks 604 and 606 respectively. Next, the reference signal $V_{cm}$ is provided at the non-inverting input terminal the comparator 108, and is compared with the detected common-mode voltage level of the differential signal as described in blocks 608 and 610 respectively. Finally, an adjusting signal is provided at the output terminal 110 of the comparator 108 along the path 111. The adjusting signal is injected into the converter 102 in order to adjust the subsequent common-mode voltage level of the differential signal based upon the adjusting signal as respectively described in blocks 612, 614, and 616.

CONCLUSION

Using the technique of the present invention, a single-ended signal can be converted into a differential signal in a low voltage environment having significantly improved linearity characteristics when compared to conventional techniques. Also, the technique of the present invention can be used to adjust and suppress unwanted common-mode voltages in a stable manner. Finally the functions of single ended to differential conversion, attenuation, and common-mode voltage adjustment can be combined and provided on a single IC to provide hardware savings on associated circuit boards.

The foregoing description of the preferred embodiments provide an illustration and description, but is not intended to be exhaustive or to limit the invention to the precise form disclosed. Modification and variations are possible, consistent with the above teachings or may be acquired from practice of the invention. Thus, it is noted that the scope of the invention is defined by the claims and their equivalents.

What is claimed is:

1. A method to convert a single-ended signal to a differential signal, comprising:

attenuating a single-ended signal received within an attenuator and producing a differential signal at differential output ports formed within the attenuator, the differential signal being based upon the attenuated single-ended signal and a received DC signal;

detecting a common-mode voltage level of the differential signal and providing the detected common-mode voltage level to an inverting input port of an amplifier;

providing a reference common-mode voltage signal to a non-inverting input port of the amplifier;

comparing the detected common-mode voltage level with a voltage level of the reference signal and providing an adjusting signal at an amplifier output port based upon the comparison; and adjusting common-mode voltage levels of subsequently produced differential signals based upon the adjusting signal.

2. The method of claim 1, wherein an adjusted common-mode voltage level is substantially equal to the voltage level of the reference signal.

3. An apparatus for converting a single-ended signal to a differential signal, comprising:

means for attenuating a single-ended signal received within an attenuator and producing a differential signal at differential output ports formed within the attenuator, the differential signal being based upon the attenuated single-ended signal and a received DC signal;

means for detecting a common-mode voltage level of the differential signal and providing the detected common-mode voltage level to an inverting input port of an amplifier;

means for providing a reference common-mode voltage signal to a non-inverting input port of the amplifier;

means for comparing the detected common-mode voltage level with a voltage level of the reference signal and providing an adjusting signal at an amplifier output port based upon the comparison; and means for adjusting common-mode voltage levels of subsequently produced differential signals based upon the adjusting signal.

4. The apparatus of claim 3, wherein an adjusted common-mode voltage level is substantially equal to the voltage level of the reference signal.

* * * * *